US008971128B2

(12) United States Patent
Chin et al.

(10) Patent No.: US 8,971,128 B2
(45) Date of Patent: Mar. 3, 2015

(54) ADAPTIVE INITIAL PROGRAM VOLTAGE FOR NON-VOLATILE MEMORY

(71) Applicant: Sandisk Technologies, Inc., Plano, TX (US)

(72) Inventors: Henry Chin, Fremont, CA (US); Dana Lee, Saratoga, CA (US)

(73) Assignee: Sandisk Technologies Inc., Plano, TX (US)

( * ) Notice: Subject to any disclaimer, the term of this patent is extended or adjusted under 35 U.S.C. 154(b) by 141 days.

(21) Appl. No.: 13/756,387

(22) Filed: Jan. 31, 2013

(65) Prior Publication Data

US 2014/0215128 A1     Jul. 31, 2014

(51) Int. Cl.
G11C 16/04      (2006.01)
G06F 12/02      (2006.01)
G11C 16/34      (2006.01)
G11C 16/10      (2006.01)
G11C 11/56      (2006.01)

(52) U.S. Cl.
CPC ............ G11C 16/10 (2013.01); G06F 12/0246 (2013.01); G11C 16/3486 (2013.01); G11C 11/5628 (2013.01)
USPC .............. 365/185.28; 365/185.03; 365/185.18

(58) Field of Classification Search
USPC ..................................................... 365/185.28
See application file for complete search history.

(56) References Cited

U.S. PATENT DOCUMENTS

| 5,200,920 | A  | 4/1993  | Norman |
| 6,205,055 | B1 | 3/2001  | Parker |
| 7,339,834 | B2 | 3/2008  | Lutze  |
| 7,495,966 | B2 | 2/2009  | Aritome |
| 7,564,715 | B2 | 7/2009  | Mokhlesi |
| 7,570,520 | B2 | 8/2009  | Kamei |
| 7,764,542 | B2* | 7/2010 | Edahiro et al. ........... 365/185.03 |
| 7,839,690 | B2 | 11/2010 | Lee |
| 7,929,350 | B2 | 4/2011  | Hwang |
| 8,045,375 | B2 | 10/2011 | Hemink |
| 8,111,554 | B2* | 2/2012 | Lutze ....................... 365/185.19 |
| 8,117,375 | B2 | 2/2012  | Sarin |
| 8,125,832 | B2 | 2/2012  | Mokhlesi |
| 8,223,554 | B2 | 7/2012  | Hemink |
| 8,254,177 | B2 | 8/2012  | Hemink |
| 8,369,157 | B2* | 2/2013 | Moschiano et al. ...... 365/185.28 |
| 8,422,302 | B2* | 4/2013 | Hemink .................... 365/185.19 |
| 2002/0118574 | A1 | 8/2002 | Gongwer |
| 2005/0083735 | A1 | 4/2005 | Chen |
| 2005/0276101 | A1 | 12/2005 | Chen |
| 2006/0120165 | A1 | 6/2006 | Hemink |
| 2008/0266970 | A1 | 10/2008 | Lee |

(Continued)

OTHER PUBLICATIONS

PCT International Search Report dated Jul. 17, 2014, PCT Patent Application No. PCT/US2014/013889.

(Continued)

*Primary Examiner* — Son Mai

(74) *Attorney, Agent, or Firm* — Vierra Magen Marcus LLP

(57) ABSTRACT

When programming a set of non-volatile storage elements using a multi-stage programming process, a series of programming pulses are used for each stage. The magnitude of the initial program pulse for the current stage being performed is dynamically set as a function of the number of program pulses used for the same stage of the multi-stage programming process when programming non-volatile storage elements connected to on one or more previously programmed word lines.

28 Claims, 11 Drawing Sheets

(56) References Cited

U.S. PATENT DOCUMENTS

2009/0238006 A1 9/2009 Nobunaga
2010/0103733 A1 4/2010 Hemink

OTHER PUBLICATIONS

PCT Written Opinion of the International Searching Authority dated Jul. 17, 2014, PCT Patent Application No. PCT/US2014/013889.

* cited by examiner

Fig. 9A
| Wordline | Upper/ Lower Page | All Bit Lines |
|---|---|---|
| WL3 | upper | Page 8 |
|  | lower | Page 5 |
| WL2 | upper | Page 6 |
|  | lower | Page 3 |
| WL1 | upper | Page 4 |
|  | lower | Page 1 |
| WL0 | upper | Page 2 |
|  | lower | Page 0 |
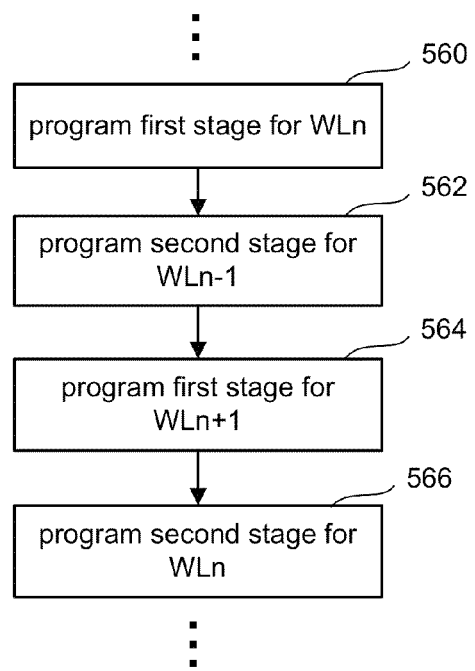
Fig. 9B
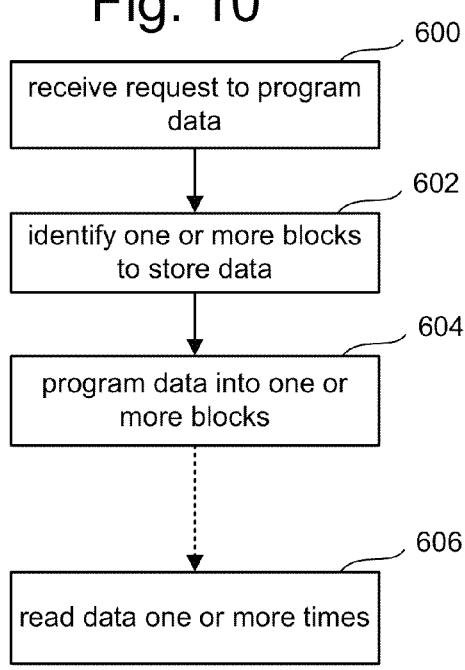
Fig. 10
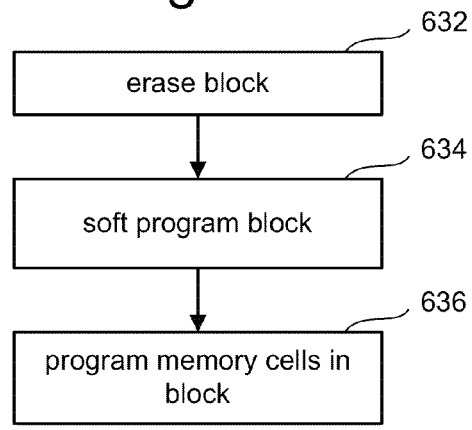
Fig. 11

| PC for previous WL | Vpgm_init shift for previous WL (in units of ΔVpgm) | | | | | | |
|---|---|---|---|---|---|---|---|
| | 0 | 1 | 2 | 3 | 4 | 5 | 6 |
| <5 | 0 | 0 | 0 | 0 | 0 | 0 | 0 |
| 5 | 0 | 0 | 0 | 0 | 0 | 0 | 0 |
| 6 | 0 | 0 | 0 | 0 | 0 | 0 | 0 |
| 7 | 0 | 0 | 0 | 0 | 0 | 0 | 0 |
| 8 | 0 | 0 | 0 | 0 | 0 | 0 | 0 |
| 9 | 0 | 0 | 0 | 0 | 0 | 0 | 0 |
| 10 | 0 | 0 | 0 | 0 | 0 | 0 | 0 |
| 11 | 0 | 0 | 0 | 0 | 0 | 0 | 0 |
| 12 | 0 | 0 | 0 | 0 | 0 | 0 | 1 |
| 13 | 0 | 0 | 0 | 0 | 0 | 1 | 2 |
| 14 | 0 | 0 | 0 | 0 | 1 | 2 | 3 |
| 15 | 0 | 0 | 0 | 1 | 2 | 3 | 4 |
| 16 | 0 | 0 | 1 | 2 | 3 | 4 | 5 |
| 17* | 0 | 1 | 2 | 3 | 4 | 5 | 6 |
| 18* | 0 | 1 | 2 | 3 | 4 | 5 | 6 |
| 19 | 1 | 2 | 3 | 4 | 5 | 6 | 6 |
| 20 | 1 | 2 | 3 | 4 | 5 | 6 | 6 |
| 21 | 1 | 2 | 3 | 4 | 5 | 6 | 6 |
| 22 | 1 | 2 | 3 | 4 | 5 | 6 | 6 |
| 23 | 1 | 2 | 3 | 4 | 5 | 6 | 6 |
| 24 | 1 | 2 | 3 | 4 | 5 | 6 | 6 |
| >24 | 1 | 2 | 3 | 4 | 5 | 6 | 6 |

| PC for previous WL | Vpgm_init shift for previous WL (in units of ΔVpgm) | | | |
|---|---|---|---|---|
| | 0 | 1 | 2 | 3 |
| 0 | 0 | 0 | 0 | 0 |
| 1 | 0 | 0 | 0 | 0 |
| 2 | 0 | 0 | 0 | 0 |
| 3 | 0 | 0 | 0 | 0 |
| 4 | 0 | 0 | 0 | 0 |
| 5 | 0 | 0 | 0 | 0 |
| 6 | 0 | 0 | 0 | 1 |
| 7 | 0 | 0 | 1 | 2 |
| 8* | 0 | 1 | 2 | 3 |
| 9* | 0 | 1 | 2 | 3 |
| 10 | 1 | 2 | 3 | 3 |
| 11 | 1 | 2 | 3 | 3 |
| 12 | 1 | 2 | 3 | 3 |
| 13 | 1 | 2 | 3 | 3 |
| 14 | 1 | 2 | 3 | 3 |
| 15 | 1 | 2 | 3 | 3 |
| 17 | 1 | 2 | 3 | 3 |
| >17 | 1 | 2 | 3 | 3 |

Fig. 16

| WL | Shift | PC |
|---|---|---|
| 2 | 0 | 22 |
| 3 | 1 | 21 |
| 4 | 2 | 20 |
| 5 | 3 | 19 |
| 6 | 4 | 18 |
| 7 | 4 | 17 |
| 8 | 4 | 18 |
| 9 | 4 | 17 |
| 10 | 4 | 18 |
| 11 | 4 | 18 |
| 12 | 4 | 15 |
| 13 | 2 | 17 |
| 14 | 2 | 20 |
| 15 | 3 | 19 |
| 16 | 4 | 18 |
| 17 | 4 | 18 |
| 18 | 4 | 17 |
| 19 | 4 | 17 |
| 20 | 4 | 18 |

Fig. 17

ADAPTIVE INITIAL PROGRAM VOLTAGE FOR NON-VOLATILE MEMORY

BACKGROUND OF THE INVENTION

1. Field

The present invention relates to non-volatile storage.

2. Description of the Related Art

Semiconductor memory devices have become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Both EEPROM and flash memory utilize a floating gate that is positioned above and insulated from a channel region in a semiconductor substrate. The floating gate is positioned between source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in the programmed state. More information about programming can be found in U.S. Pat. No. 6,859,397, titled "Source Side Self Boosting Technique For Non-Volatile Memory;" and in U.S. Pat. No. 6,917,542, titled "Detecting Over Programmed Memory," both patents are incorporated herein by reference in their entirety.

Some EEPROM and flash memory devices have a floating gate that is used to store two ranges of charges and, therefore, the memory cell can be programmed/erased between two states, an erased state and a programmed state that correspond to data "1" and data "0." Such a device is referred to as a binary device.

A multi-state flash memory cell is implemented by identifying multiple, distinct allowed threshold voltage ranges. Each distinct threshold voltage range corresponds to a predetermined value for the set of data bits. The specific relationship between the data programmed into the memory cell and the threshold voltage ranges of the cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state flash memory cells.

In some embodiments, the program voltage applied to the control gate includes a series of pulses that are increased in magnitude with each successive pulse by a predetermined step size (e.g. 0.2 v, 0.3 v, 0.4 v, or others). The choice of the magnitude of program voltage is a compromise. Too high of a magnitude will result in some memory cells being over-programmed, while too low of a magnitude will result in longer programming times. Typically, users of non-volatile memory desire that the memory program quickly.

In the prior art devices, the same program signal is used for new devices that have not been significantly used (also called fresh devices) and heavily used devices. However, as a non-volatile memory device undergoes many programming cycles, charge becomes trapped in the insulation between the floating gate and the channel region. This trapping of charge shifts the threshold voltage to a higher level, which allows the memory cell to program more quickly. The program voltage at a given magnitude may not over-program a fresh device; however, that same magnitude may over-program a device that has been heavily used. Thus, new devices will have their program voltage set low enough to avoid over programming when the device is older. This lowering of the magnitude of the program voltage will reduce the speed at which the fresh device programs data.

BRIEF DESCRIPTION OF THE DRAWINGS

FIG. 9A is a table the depicts one example order of programming pages of data in a block.

FIG. 9B is a flow chart describing one example order of programming pages of data in a block.

FIG. 10 is a flow chart describing one embodiment of a process for operating non-volatile storage.

FIG. 11 is a flow chart describing one embodiment of a process for programming non-volatile storage.

FIG. 16 is an example table used to dynamically determine a magnitude of an initial program pulse.

FIG. 17 is a table that depicts one example of using the table of FIG. 15.

DETAILED DESCRIPTION

The technology described herein attempts to increase the speed of programming while reducing the risk of over-programming by dynamically adjusting the magnitude of the initial programming pulse. When programming a set of non-volatile storage elements using a multi-stage programming process, a series of programming pulses are used for each stage. The magnitude of the initial program pulse for the current stage being performed is dynamically set as a function of the number of program pulses used for the same stage of the multi-stage programming process when programming non-volatile storage elements connected to one or more previously programmed word lines.

Figure 1:
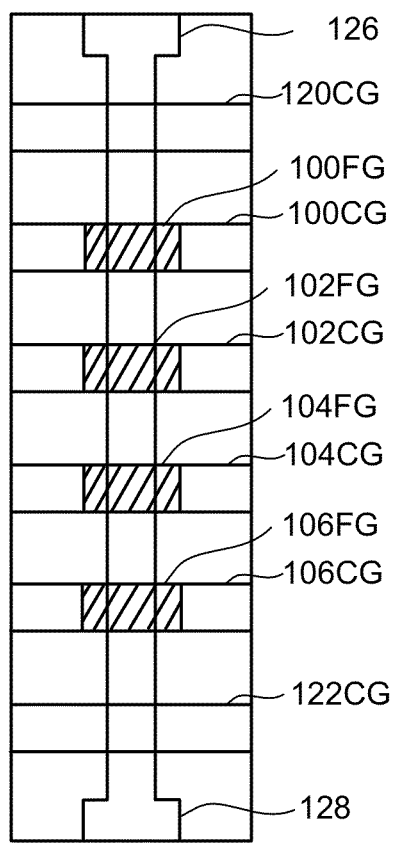
FIG. 1 is a top view of a NAND string.
Figure 2:
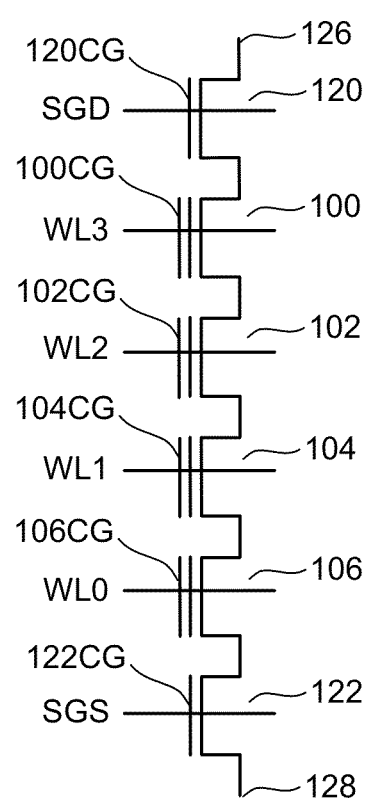
FIG. 2 is an equivalent circuit diagram of the NAND string.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (drain side) select gate 120 and a second (source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND structure will include several NAND strings. Each NAND string is connected to the common source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to a sense amplifier.

Relevant examples of NAND type flash memories and their operation are provided in the following U.S. Patents/Patent Applications, all of which are incorporated herein by reference: U.S. Pat. Nos. 5,570,315; 5,774,397; 6,046,935; 6,456, 528; and U.S. Pat. Publication No. US2003/0002348.

Other types of non-volatile storage devices, in addition to NAND flash memory, can also be used. For example, non-volatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. U.S. Pat. Nos. 5,768,192 and 6,011,725 disclose a non-volatile memory cell having a trapping dielectric sandwiched between two silicon dioxide layers. Multi-state data storage is implemented by separately reading the binary states of the spatially separated charge storage regions within the dielectric. Non-volatile storage based on MONOS or TANOS types of structures or nanocrystals can also be used. Other types of non-volatile storage can also be used.

Figure 3:
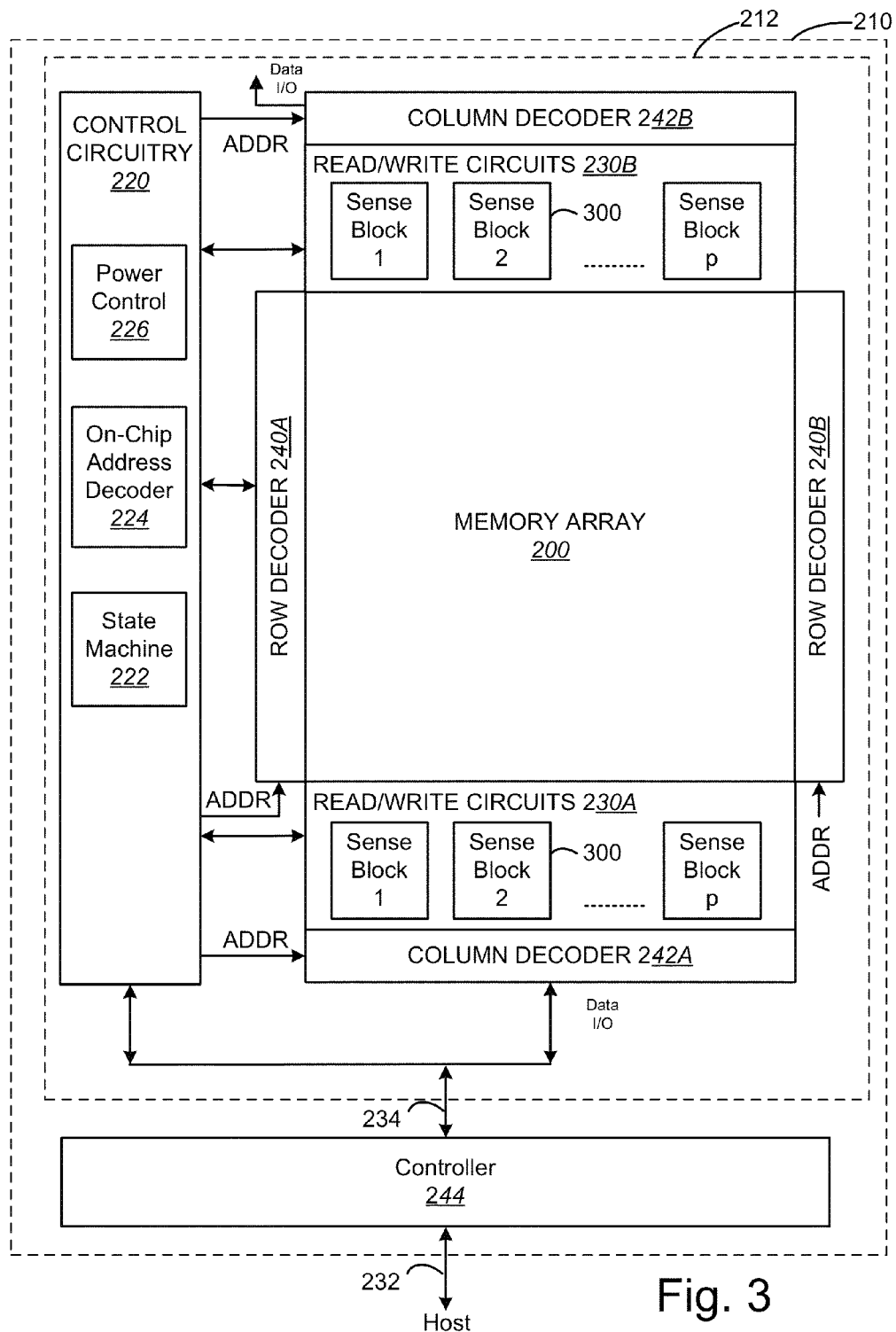
FIG. 3 is a block diagram of a non-volatile memory system.

FIG. 3 illustrates a memory device 210 having read/write circuits for reading and programming a page (or other unit) of memory cells (e.g., NAND multi-state flash memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 which allow a page of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a Controller 244 is included in the same memory device 210 (e.g., a removable storage card or package) as the one or more memory die 212. Commands and data are transferred between the host and Controller 244 via lines 232 and between the Controller 244 and the one or more memory die 212 via lines 234. In one embodiment, Controller 244 includes a data storage (Controller memory), a memory interface for interfacing with the memory chip/die and one or more processes in communication with the data storage and memory interface.

Control circuitry 220 cooperates with the read/write circuits 230A and 230B to perform memory operations on the memory array 200. The control circuitry 220 includes a state machine 222, an on-chip address decoder 224, and a power control module 226. The state machine 222 provides chip-level control of memory operations. The on-chip address decoder 224 provides an address interface between that used by the host or a memory controller to the hardware address used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage. Control circuitry 220 provides address lines ADDR to row decoders 240A and 204B, as well as column decoders 242A and 242B. Column decoders 242A and 242B provide data to controller 244 via the signal lines marked Data I/O.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits. The one or more managing circuits perform the processes described herein.

Figure 4:
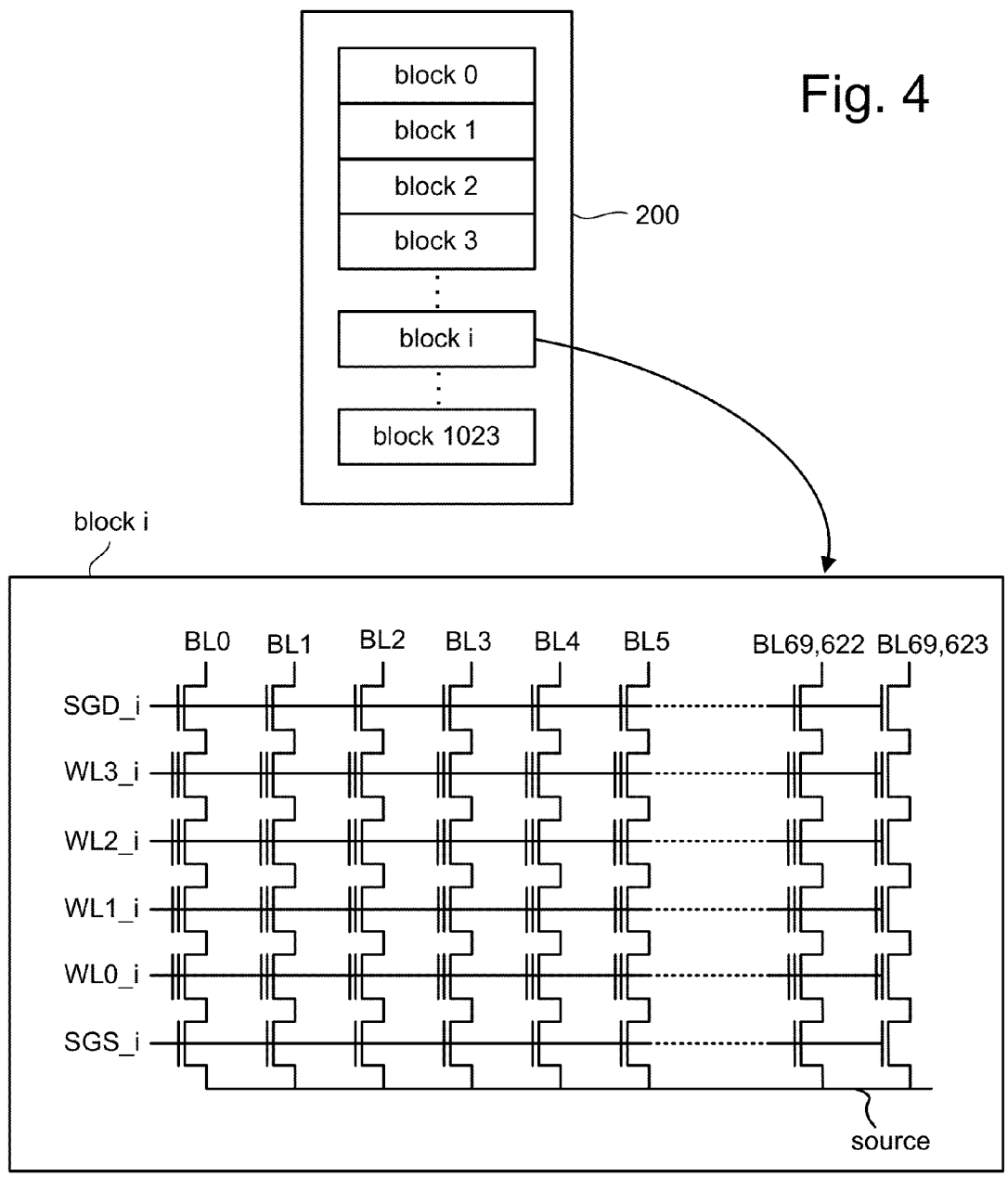
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount of blocks) of memory cells. As is common for flash memory systems, the block is the unit of erase. That is, each block contains the minimum number of memory cells that are erased together. Other units of erase can also be used.

A block contains a set of NAND stings which are accessed via bit lines (e.g., bit lines BL0-BL69,623) and word lines (WL0, WL1, WL2, WL3). FIG. 4 shows four memory cells connected in series to form a NAND string. Although four cells are shown to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used. Additionally, a block can have more or less than 69,624 bit lines.

Figure 5:
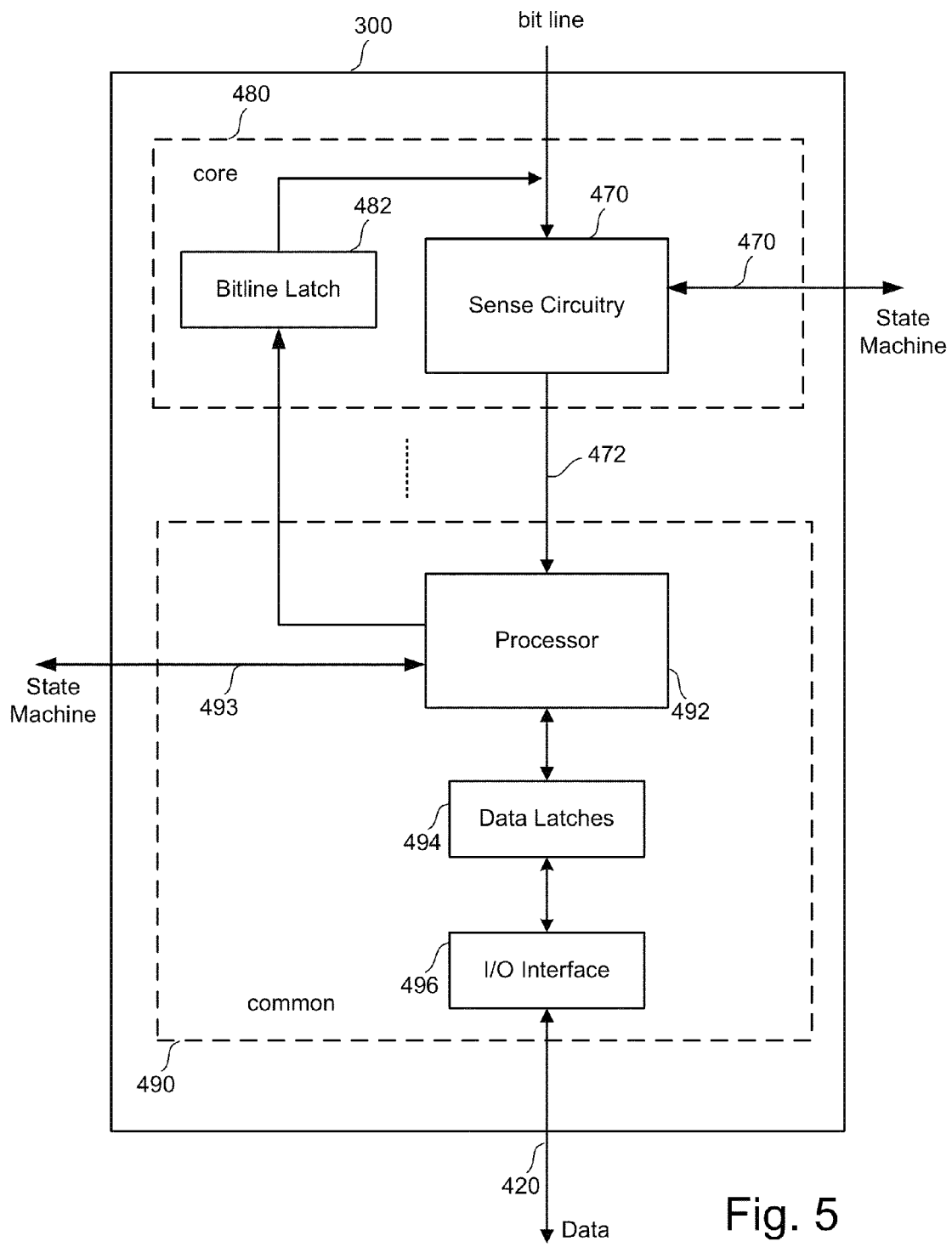
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd) in order to lock out memory cells from programming.

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. Patent Application Publication No. 2006/0158947, titled "Reference Sense Amplifier For Non-Volatile Memory," Inventors Siu Lung Chan and Raul-Adrian Cernea, filed on Dec. 28, 2005. All five of the immediately above-listed patent documents are incorporated herein by reference in their entirety.

Figure 6:
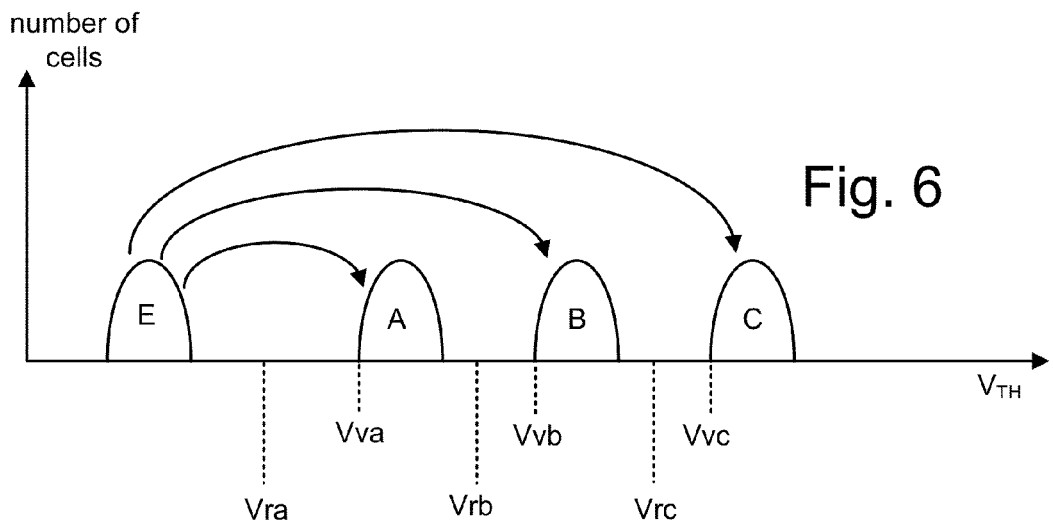
FIG. 6 depicts an example set of threshold voltage distributions and depicts an example programming process.

At the end of a successful programming process (with verification), the threshold voltages of the memory cells should be within one or more distributions of threshold voltages for programmed memory cells or within a distribution of threshold voltages for erased memory cells, as appropriate. FIG. 6 illustrates example threshold voltage distributions (corresponding to data states) for the memory cell array when each memory cell stores two bits of data. Other embodiments, however, may use more or less than two bits of data per memory cell (e.g., such as three, or four or more bits of data per memory cell).

FIG. 6 shows a first threshold voltage distribution E for erased memory cells. Three threshold voltage distributions, A, B and C for programmed memory cells are also depicted. In one embodiment, the threshold voltages in the E distribution are negative and the threshold voltages in the A, B and C distributions are positive. Each distinct threshold voltage distribution of FIG. 6 corresponds to predetermined values for the set of data bits. The specific relationship between the data programmed into the memory cell and the threshold voltage levels of the cell depends upon the data encoding scheme adopted for the cells. For example, U.S. Pat. No. 6,222,762 and U.S. Patent Application Publication No. 2004/0255090, both of which are incorporated herein by reference in their entirety, describe various data encoding schemes for multi-state flash memory cells. In one embodiment, data values are assigned to the threshold voltage ranges using a Gray code assignment so that if the threshold voltage of a floating gate erroneously shifts to its neighboring physical state, only one bit will be affected. One example assigns "11" to threshold voltage range E (state E), "10" to threshold voltage range A (state A), "00" to threshold voltage range B (state B) and "01" to threshold voltage range C (state C). However, in other embodiments, Gray code is not used. Although FIG. 6 shows four states, the present invention can also be used with other multi-state structures including those that include more or less than four states.

FIG. 6 also shows three read reference voltages, Vra, Vrb and Vrc, for reading data from memory cells. By testing whether the threshold voltage of a given memory cell is above or below Vra, Vrb and Vrc, the system can determine what state the memory cell is in. FIG. 6 also shows three verify reference voltages, Vva, Vvb and Vvc. When programming memory cells to state A, the system will test whether those memory cells have a threshold voltage greater than or equal to Vva. When programming memory cells to state B, the system will test whether the memory cells have threshold voltages greater than or equal to Vvb. When programming memory cells to state C, the system will determine whether memory cells have their threshold voltage greater than or equal to Vvc.

In one embodiment, known as full sequence programming, memory cells can be programmed from the erase state E directly to any of the programmed states A, B or C. For example, a population of memory cells to be programmed may first be erased so that all memory cells in the population are in erased state E. Then, a programming process is used to program memory cells directly into states A, B or C. While some memory cells are being programmed from state E to state A, other memory cells are being programmed from state E to state B and/or from state E to state C.

Figure 7:
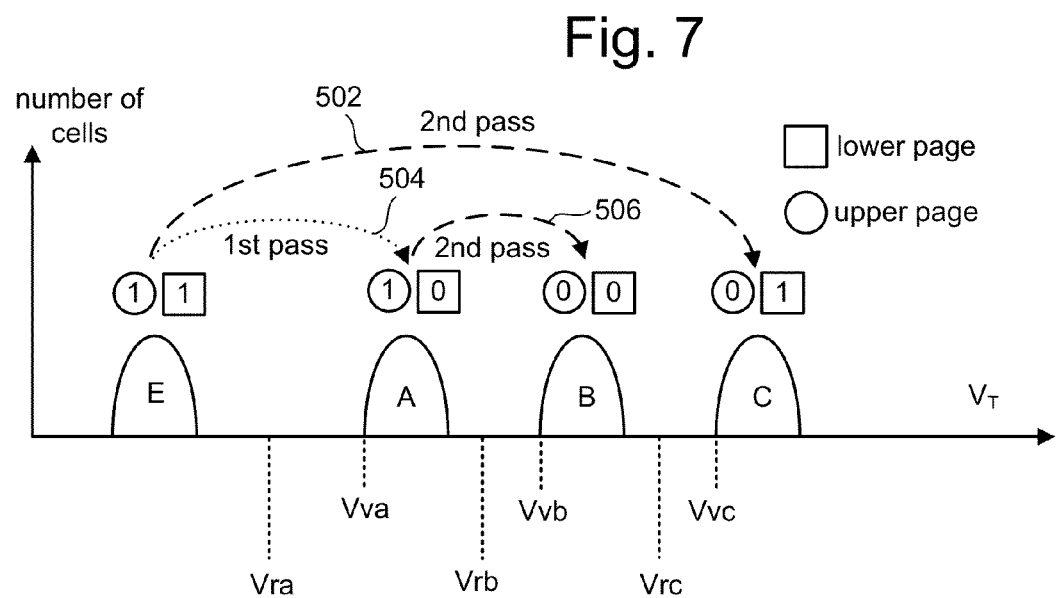
FIG. 7 depicts an example set of threshold voltage distributions and depicts an example programming process.

FIG. 7 illustrates one example of a two-stage technique of programming a multi-state memory cell that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming stage, the memory cells' threshold voltages levels are set according to the bit to be programmed into the lower logical page. If that bit is a logic "1," the threshold voltage is not changed since the respective memory cell is in the appropriate state as a result of having been earlier erased. However, if the bit to be programmed is a logic "0," the threshold level of the cell is increased to be state A, as shown by arrow 504. That concludes the first programming stage.

In a second programming stage, the memory cell's threshold voltage level is set according to the bit being programmed into the upper logical page. If the upper logical page bit is to store a logic "1," then no programming occurs since the memory cell is in one of states E or A, depending upon the programming of the lower page bit, both of which carry an upper page bit of "1." If the upper page bit is to be a logic "0," then the threshold voltage is shifted. If the first stage resulted in the memory cell remaining in the erased state E, then in the second stage the memory cell is programmed so that the threshold voltage is increased to be within state C, as depicted by arrow 502. If the memory cell had been programmed into state A as a result of the first programming stage, then the memory cell is further programmed in the second stage so that the threshold voltage is increased to be within state B, as depicted by arrow 506. The result of the second stage is to program the memory cell into the state designated to store a logic "0" for the upper page without changing the data for the lower page.

In one embodiment, a system can be set up to perform full sequence writing if enough data is written to fill up an entire page. If not enough data is written for a full page, then the programming process can program the lower page programming with the data received. When subsequent data is received, the system will then program the upper page. In yet another embodiment, the system can start writing in the mode that programs the lower page and convert to full sequence programming mode if enough data is subsequently received to fill up an entire (or most of a) word line's memory cells. More details of such an embodiment are disclosed in U.S. Patent Application 2006/0126390, incorporated herein by reference in its entirety.

Figure 8A:
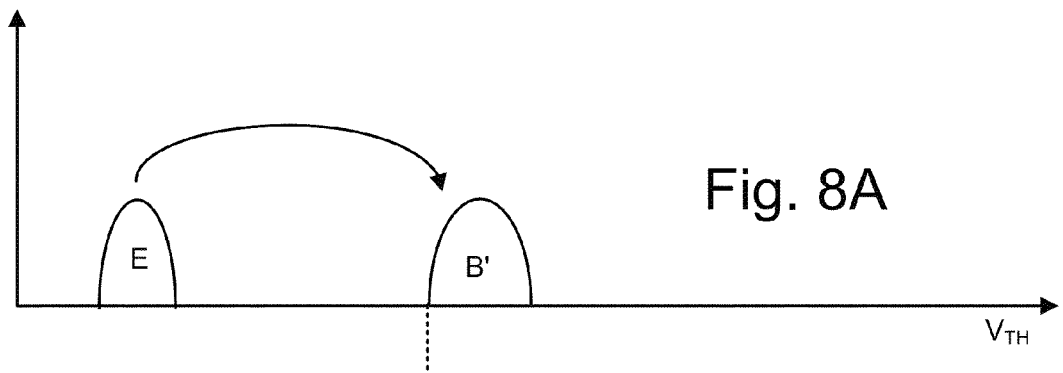
FIGS. 8A-8C depict examples of threshold voltage distributions and an example programming process.
Figure 8B:
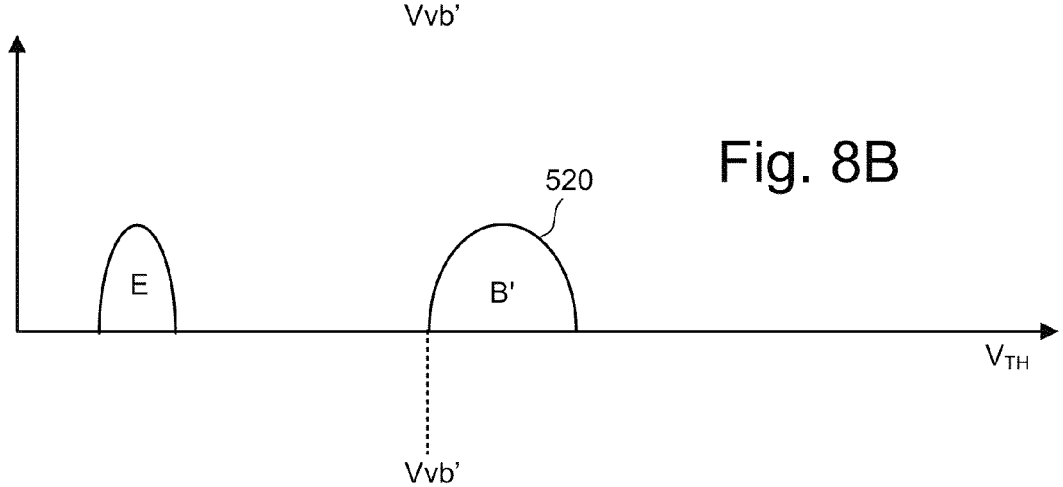
Figure 8C:
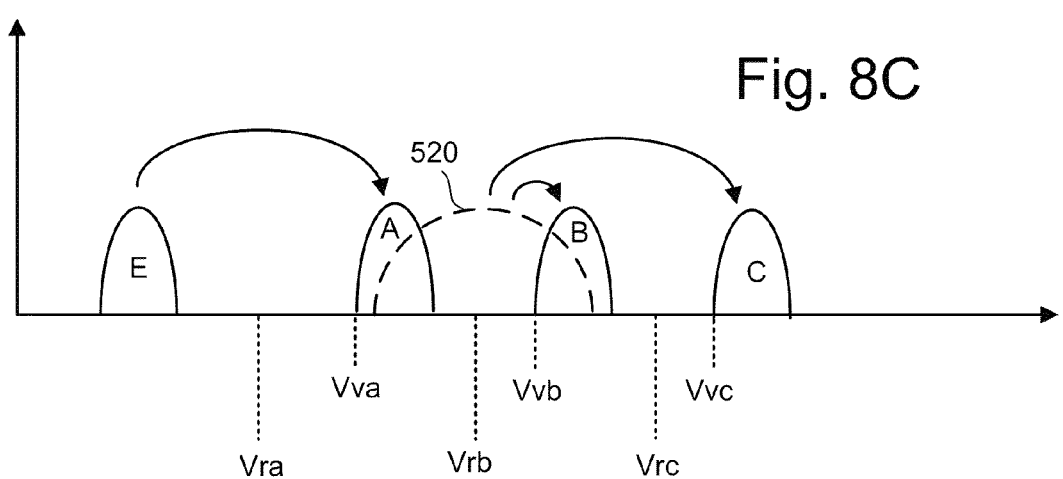

FIGS. 8A-C describe another multi-stage programming process for programming non-volatile memory. The process of FIG. 8A-C reduces floating gate to floating gate coupling by, for any particular memory cell, writing to that particular memory cell with respect to a particular page subsequent to writing to adjacent memory cells for previous pages. In one example of an implementation of the process taught by FIGS. 8A-C, the non-volatile memory cells store two bits of data per memory cell, using four data states. For example, assume that state E is the erased state and states A, B and C are the programmed states. State E stores data 11. State A stores data 01. State B stores data 10. State C stores data 00. This is an example of non-Gray coding because both bits change between adjacent states A & B. Other encodings of data to physical data states can also be used. Each memory cell stores two pages of data. For reference purposes, these pages of data will be called upper page and lower page; however, they can be given other labels. With reference to state A for the process of FIGS. 8A-C, the upper page stores bit 0 and the lower page stores bit 1. With reference to state B, the upper page stores bit 1 and the lower page stores bit 0. With reference to state C, both pages store bit data 0. The programming process of FIGS. 8A-C is a two-stage programming process; however, the process of FIGS. 8A-C can be used to implement a three stage process, a four state process, etc. In the first stage, the lower page is programmed. If the lower page is to remain data 1, then the memory cell state remains at state E. If the data is to be programmed to 0, then the threshold of voltage of the memory cell is raised such that the memory cell is programmed to state B'. FIG. 8A therefore shows the programming of memory cells from state E to state B'. State B' depicted in FIG. 8A is an interim state B; therefore, the verify point is depicted as Vvb', which is lower than Vvb. FIG. 8A shows the first stage of programming, used to program the lower page data.

In one embodiment, after a memory cell is programmed from state E to state B', its neighbor memory cell (on word line WLn+1) in the NAND string will then be programmed with respect to its lower page. After programming the neighbor memory cell, the floating gate to floating gate coupling effect may raise the apparent threshold voltage of earlier programmed memory cell. This will have the effect of widening the threshold voltage distribution for state B' to that depicted as threshold voltage distribution 520 of FIG. 8B. This apparent widening of the threshold voltage distribution will be remedied when programming the upper page.

FIG. 8C depicts the process of programming the upper page (the second stage). If the memory cell is in erased state E and the upper page is to remain at 1, then the memory cell will remain in state E. If the memory cell is in state E and its upper page data is to be programmed to 0, then the threshold voltage of the memory cell will be raised so that the memory cell is in state A. If the memory cell was in intermediate threshold voltage distribution 520 and the upper page data is to remain at 1, then the memory cell will be programmed to final state B. If the memory cell is in intermediate threshold voltage distribution 520 and the upper page data is to become data 0, then the threshold voltage of the memory cell will be raised so that the memory cell is in state C. The process depicted by FIGS. 8A-C reduces the effect of floating gate to floating gate coupling because only the upper page programming of neighbor memory cells will have an effect on the apparent threshold voltage of a given memory cell. An example of an alternate state coding is to move from distribution 520 to state C when the upper page data is a 1, and to move to state B when the upper page data is a 0.

Although FIGS. 8A-C provide an example with respect to four data states and two pages of data, the concepts taught by FIGS. 8A-C can be applied to other implementations with more or less than four states and different than two pages. More details about the programming process of FIG. 8A-C can be found in U.S. Pat. No. 7,196,928, incorporated herein by reference.

FIG. 9 is a table that describes one embodiment of the order for programming memory cells utilizing the programming method of FIGS. 8A-C. For memory cells connected to word line WL0, the lower page forms page 0 and the upper page forms page 2. For memory cells connected to word line WL1, the lower page forms page 1 and the upper page forms page 4. For memory cells connected to word line WL2, the lower page forms page 3 and the upper page forms page 6. For memory cells connected to word line WL3, the lower page forms page 5 and the upper page forms page 5, and so on. In this embodiment, memory cells are programmed according to page number: page 0, page 1, page 2, page 3, . . . . The first stage of the two above—described multi-stage programming processes is used to program the lower page of data and the second stage is used to program the upper page of data.

FIG. 9B is a flow chart that also describes the order of programming pages of data in a block. The four steps are generically described, and can apply to any set of word lines. For a currently selected word line, WLn, the first stage of the multi-stage programming processes is use to program the lower page of data (step 560). Subsequently, the second stage of the multi-stage programming processes is used to program upper page of data for the word line WLn−1 (step 560), where WLn−1 is adjacent WLn and was subjected to the first stage of programming prior to subjecting WLn to the first stage of programming. Subsequently, the first stage of the multi-stage programming processes is used to program lower page of data for the word line WLn+1 (step 564), where WLn+1 is adjacent WLn and was subjected to the first stage of programming after subjecting WLn to the first stage of programming. Subsequently, the second stage of the multi-stage programming processes is used to program upper page of data for the word line WLn (step 566). This process will repeat for all word lines (or a subset of word lines). In one embodiment, the first and last word line are not programmed according to the order of FIGS. 9A and/or 9B. However, as can been seen, in one embodiment the order of programming is somewhat in the direction of source side to drain side. Other orders of programming can also be used.

FIG. 10 is a flow chart describing one embodiment of a process for operating non-volatile memory, such as the system of FIG. 3 (or other systems). In step 600, a request to program data is received. The request can be from a host, another device or the controller. The request can be received at the controller, control circuitry, state machine, or other device. In response to the request, the controller, control circuitry, state machine, or other device will determine which block of flash memory cells will be used to store the data in step 602. The data will be programmed into the determined block using any of the programming processes described above (or other programming processes) in step 604. The programmed data will be read one or many times in step 606. There is a dashed line between steps 604 and 606 because an unpredictable amount of time may pass between the steps, and step 606 is not performed in response to step 604. Rather, step 606 is performed in response to a request to read the data or other event.

FIG. 11 is a flow chart describing a programming process for programming memory cells in a block. FIG. 11 is one embodiment of step 604 of FIG. 10. In step 632, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is, thus, applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells are lowered. Erasing can be performed on the entire memory array, on individual blocks, or another unit of cells. Other techniques for erasing can also be used. In step 634, soft programming is performed to narrow the threshold voltage distribution of the erased memory cells. Some memory cells may be in a deeper erased state than necessary as a result of the erase process. Soft programming can apply programming pulses to move the threshold voltage of the deeper erased memory cells to a higher threshold voltage that is still in a valid range for the erased state. In step 636, the memory cells of the block are programmed as described herein. In one embodiment, step 636 includes programming memory cells connected to many or all word lines for a block. In one example, the order of programming is according to FIG. 9A or FIG. 9B. However, other orders of programming can also be used.

The process of FIG. 11 can be performed at the direction of the State Machine 222, Controller 244 or combination of State Machine 222 and Controller 244, using the various circuits described above. For example, the controller may issue commands and data to the state machine to program the data. In response, the state machine may operate the circuits described above to carry out the programming operations.

Figure 12:
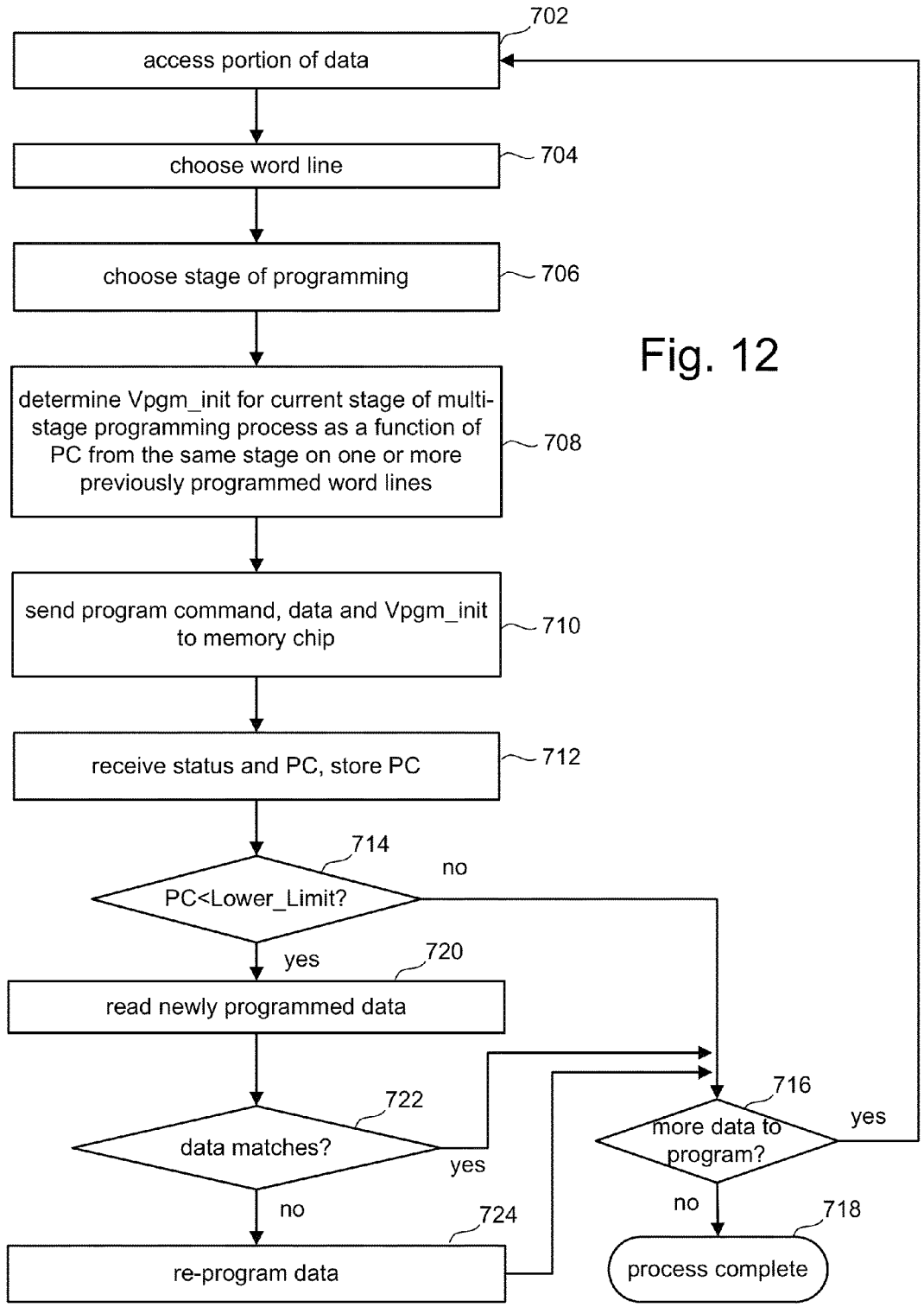
FIG. 12 is a flow chart describing one embodiment of a process for programming memory cells in a block.

FIG. 12 is a flowchart describing one embodiment of a process performed by a Controller 244 to program memory cells in a block. For example, the process of FIG. 12 can be performed as one example implementation of step 636 of FIG. 11. In step 702 of FIG. 12, Controller 244 accesses a portion of the data that needs to be programmed. For example, one page of data may be accessed. In step 704, a word line is chosen for programming that data. If the Controller is implementing the order depicted in FIG. 9A or 9B, then the next word line in the order will be chosen. In step 706, Controller 244 chooses the appropriate stage (e.g. first stage or second stage) of the multi-stage programming process to use to program the accessed portion of data into the chosen word line. In step 708, Controller 244 determines/calculates the magnitude of the initial program pulse for the programming voltage (Vpgm) for the current stage of the multi-stage programming process as a function of the program counter PC from the same stage of the multi-stage programming process for one or more previously programmed word lines. The program counter PC provides an indication of the number of program pulses applied during the current stage to the memory cells being programmed. Alternatively, the program counter provides an indication of the number of program loops/iterations performed (e.g., iterations of steps 806-808 of FIG. 13) during the current stage. The program loop count PC is an integer, usually between one and 26. However, other ranges and types of numbers can also be used. More details of the program counter PC are described below with respect to FIG. 13.

For an example implementation of step 708, consider the order of programming depicted in FIG. 9A or 9B. When programming the lower page of WL3 (Page 5), Controller 244 determines the magnitude of the initial programming pulse for Page 5 based on or as a function of the program counter PC from programming the lower page of WL2 (Page 3) and the lower page for WL1 (Page 1). In other words, when programming the first stage for WL3 (Page 5), Controller 244 determines the magnitude of the initial programming pulse to use during the first stage of programming for WL3 (Page 5) as a function of the number of programming pulses (or the number of program loops/iterations performed) when performing the first stage for WL2 and/or WL1. So when performing the first stage of a multi-stage programming process, the Controller considers results from performance of the first page of other word lines already programmed. When programming the second stage of a programming process, Controller 244 considers results from performance of the second stage of the multi-stage programming process for other word lines already programmed.

The function used in step 708 to calculate the magnitude of the initial programming pulse can include an average of program counts, a rolling average (i.e. of the last X word lines) of program counts, the median of program counts, another mathematical function of program counts, or a table of lookup values based on program counts. In another example, the function can be an average of the most recent X program counts word lines, without considering outlier word lines. (An outlier word line could for example be defined as one with a program count being more than a standard deviation from the mean). Other mathematical functions can also be used. In some (but not all) embodiments, the system will ignore the first word line (WL0) or first set of word lines. In other embodiments, the system may only consider previous word lines of the same parity as the current one. (Thus, when programming an even word line only the program counts from previous even word lines would be used.) In yet another embodiment, the system may only consider past programming of this particular WL (e.g. WL0) on other blocks. Based on the results of the function, the system can choose to raise the magnitude of the initial program voltage, lower the magnitude of the initial program voltage or keep it the same. For example, if the average PC for previously programmed word lines is higher than desired, then the magnitude of the initial program voltage can be raised. In one embodiment, the Controller will seek to achieve an average of 17-18 program pulses when programming an upper page of data and the Controller will seek to achieve an average of 8-9 program pulses when programming an upper page of data.

In step 710, Controller 244 sends a command to the memory chip 212, and more specifically to state machine 222, to program data. Controller 244 also sends the data to be programmed and the value of the magnitude of the initial program pulse (Vpgm_init). In one embodiment, the memory chip 212 has a nominal value for the magnitude of the initial program pulse and the Controller will only send adjustments to the nominal value. In some cases, this nominal value is set during die sort (and can be referred to as the trimmed value). In response to the information sent in step 712, the memory chip 212 will perform the commanded program operation. In step 712, Controller 244 will receive the results from the programming which will include a status and the final program counter PC from the programming operation. The program counter PC is stored. In step 714, it is determined whether the program counter PC is less than a lower limit. For example, the system may determine that if programming happens too fast (too few programming loops/pulse), then there may be a problem. If PC is not less than the Lower_Limit, then it is assumed there is no problem. In step 716, Controller 244 determines whether more data needs to be programmed for that block. If not, the process is complete (step 718). If there is more data to program, then the process will loop back to step 702 and Controller 244 accesses the next portion of data to be programmed according to the process of FIG. 12.

If, in step 714, it is determined that the program counter PC is lower than the Lower_Limit (one example of a Lower_Limit is 14), then Controller 244 will check to see if there is a problem with the data programmed. In step 720, the Controller 244 reads the newly programmed data from the memory cells that were the subject of the programming operation by sending a read command to memory chip 212. That data will be read according to the standard read process, which includes using error correction codes (ECC) to recover any errors. If the ECC process completes successfully, it is assumed that the data matches what was programmed. In some embodiments, the system can also compare the data read in step 720 to the data stored in Controller 244 from the programming process itself. If the data matches (step 722), then there is no problem and the process will continue at step 716. If the data does not match, then the data is reprogrammed in step 724 (possibly to a different physical memory location) and the process will then continue at step 716.

Figure 13:
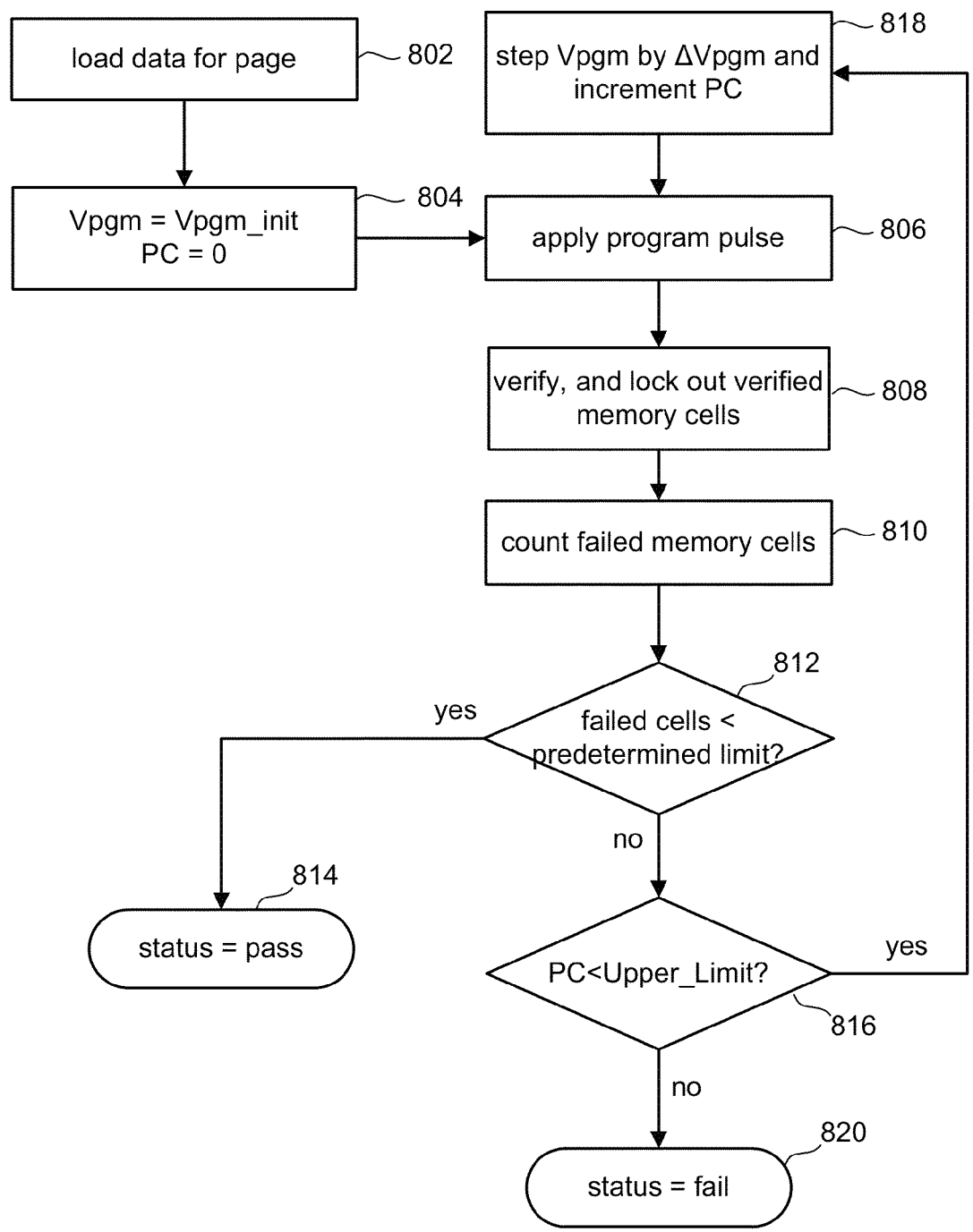
FIG. 13 is a flow chart describing one embodiment of a process for programming memory cells connected to a word line.

FIG. 13 is a flow chart describing one embodiment of a process for performing programming on one or more memory cells connected to a common word line. Therefore, when programming a block of memory cells the process of FIG. 13 is performed one or more times for each word line of the block. The process of FIG. 13 can be performed one or multiple times during step 636 of FIG. 11. For example, the process of FIG. 13 can be used to program memory cells (e.g., full sequence programming) from state E directly to any of states A, B or C. Alternatively, the process of FIG. 13 can be used to perform one or each of the stages of the process of FIG. 7 or FIGS. 8A-C. For example, when performing the process of FIGS. 8A-C, the process of FIG. 13 is used to implement the first stage that includes programming some of the memory cells from state E to state B'. The process of FIG. 13 can then be used again to implement the second stage that includes programming some of the memory cells from state E to state A and from state B' to states B and C. In some embodiments, it is likely that the process of FIG. 13 will be performed many times during step 636, according to the process of FIG. 9B (or 9A). In one embodiment, the process of FIG. 13 is performed at the direction of the state machine in response to the Controller performing step 710 of FIG. 12.

In step 802, the data to be programmed (that has been received from the Controller), is stored in the appropriate latches 494. In step 804, the programming voltage (Vpgm) is initialized to the magnitude (e.g., ~12-16V or another suitable level) of the initial programming pulse, as determined and instructed by the Controller. In other embodiments, the State Machine or other component can determine the magnitude (e.g., ~12-16V or another suitable level) of the initial programming pulse. In addition, step 804 includes initializing a program counter PC maintained by state machine 222 to 0.

Figures 14, 15:
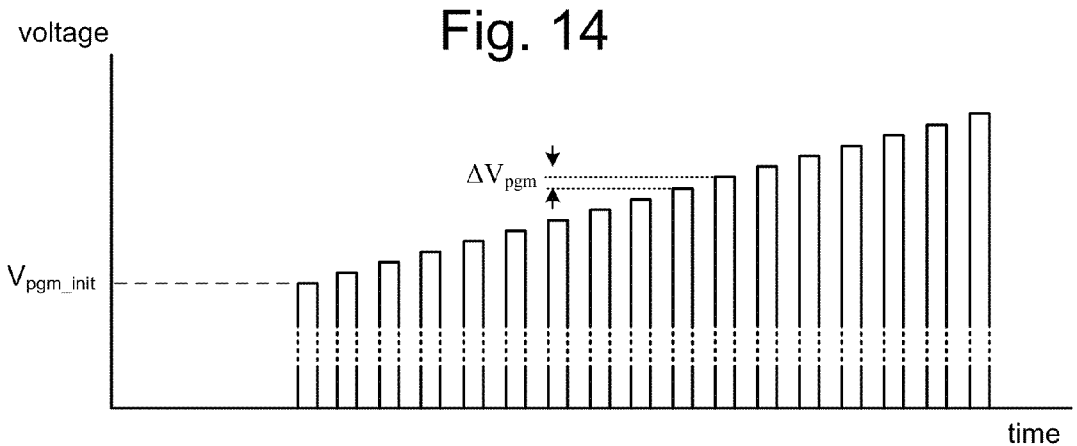
FIG. 14 depicts an example set of programming pulses.
FIG. 15 is an example table used to dynamically determine a magnitude of an initial program pulse.

Typically, the program voltage applied to the control gate during a program operation is applied as a series of program pulses. Between programming pulses are a set of one or more verify pulses to perform verification. In many implementations, the magnitude of the program pulses is increased with each successive pulse by a predetermined step size, referred to as ΔVpgm. For example, FIG. 14 shows a set of programming pulses that comprise Vpgm, with the magnitude of the initial program pulse depicted as Vpgm_init and the step size depicted as ΔVpgm. In step 806 of FIG. 13, a program pulse of the program signal Vpgm is applied to the selected word line (the word line selected for programming). In one embodiment, the memory cells being programmed are all connected to the same word line (the selected word line). The unselected word lines receive one or more boosting voltages (e.g., ~9 volts) to perform boosting schemes known in the art in order to avoid program disturb. There are many different boosting schemes that can be used with the technology described herein. In one embodiment, if a memory cell should be programmed, then the corresponding bit line is grounded. On the other hand, if the memory cell should remain at its current threshold voltage, then the corresponding bit line is connected to Vdd to inhibit programming. In step 806, the program pulse is concurrently applied to all memory cells connected to the selected word line so that all of the memory cells connected to the selected word line that should be programmed are programmed concurrently. That is, they are programmed at the same time (or during overlapping times). In this manner all of the memory cells connected to the selected word line will concurrently have their threshold voltage change, unless they have been locked out from programming.

In step 808, the appropriate memory cells are verified using the appropriate set of target levels to perform one or more verify operations. If a memory cell is verified to have reached its target, it is locked out from further programming. One embodiment for locking out a memory cell from further programming is to raise the corresponding bit line voltage to, for example, Vdd.

In step 810, the system counts the number of memory cells that have not yet reached their respective target threshold voltage distribution. That is, the system counts the number of memory cells that have failed the verify process. This counting can be done by the state machine, the controller, or other logic. In one implementation, each of the sense blocks 300 (see FIG. 3) will store the status (pass/fail) of their respective memory cells. These values can be counted using a digital counter. As described above, many of the sense blocks have an output signal that is wire-OR'd together. Thus, checking one line can indicate that no cells of a large group of cells have failed verify. By appropriately organizing the lines being wired-OR together (e.g., a binary tree-like structure), a binary search method can be used to determine the number of cells that have failed. In such a manner, if a small number of cells failed, the counting is completed rapidly. If a large number of cells failed, the counting takes a longer time. More information can be found in United States Patent Publication 2008/0126676, incorporated herein by reference in its entirety. In another alternative, each of the sense amplifiers can output an analog voltage or current if its corresponding memory cell has failed and an analog voltage or current summing circuit can be used to count the number of memory cells that have failed. In one embodiment, there is one total counted, which reflects the total number of memory cells currently being programmed that have failed the last verify step. In another embodiment, separate counts are kept for each data state.

In step 812, it is determined whether the count from step 810 is less than or equal to a predetermined limit. In one embodiment, the predetermined limit is the number of bits that can be corrected by ECC during a read process for the page of memory cells. If the number of failed cells is less than or equal to the predetermined limit, than the programming process can stop and a status of "PASS" is reported in step 814. In this situation, enough memory cells programmed correctly such that the few remaining memory cells that have not been completely programmed can be corrected using ECC during the read process. In some embodiments, step 810 will count the number of failed cells for each sector, each target data state or other unit, and those counts will individually or collectively be compared to a threshold in step 812. In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed, temperature or other criteria.

If the number of failed cells is not less than the predetermined limit, then the programming process continues at step 816 and the program counter PC is checked against an Upper limit value. One example of a program limit value is 26; however, other values can be used. If the program counter PC is not less than the upper limit value, then the program process is considered to have failed and a status of FAIL is reported in step 820. If the program counter PC is less than the upper limit value, then the process continues at step 818 during which time the Program Counter PC is incremented by 1 and the program voltage Vpgm is stepped up to the next magnitude. For example, the next pulse will have a magnitude greater than the previous pulse by a step size (e.g., a step size of 0.1-0.7 volts). After step 818, the process loops back to step 806 and another program pulse is applied to the selected word line.

During verify operations (e.g., step 808) and read operations, the selected word line is connected to a voltage, a level of which is specified for each read operation (e.g., Vra, Vrb, and Vrc,) or verify operation (e.g. Vva, Vvb, and Vvc) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line voltage. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287; (2) United States Patent Application Pub No. 2004/0109357; (3) U.S. Patent Application Pub. No. 2005/0169082; and (4) U.S. Patent Application Pub. No. 2006/0221692. The erase, read and verify operations described above are performed according to techniques known in the art. Thus, many of the details explained can be varied by one skilled in the art. Other erase, read and verify techniques known in the art can also be used.

FIG. 15 is a table that can be stored in memory (data storage) of Controller 244, to be used as part of step 708 of FIG. 12. The table of FIG. 15 is used to determine the magnitude of the initial program pulse for upper page programming, which in one embodiment is the second stage of the multi-stage programming process of Figures A-C. That is, the table of FIG. 15 provides the function used by Controller 244 to perform step 708 of FIG. 12.

The left most column of FIG. 15 indicates what the program counter PC was for the most recently programmed word line for the same stage as currently being programmed. For example, if Controller 244 is programming the upper page for WL3 (Page 8 of FIG. 9A), then the left most column of FIG. 15 describes the program counter PC for the upper page of word line WL2. The seven columns to the right of the left most column of FIG. 15 indicate the shift used by the Controller when programming the most recently programmed word line whose PC is indicated in the left most column. That is, FIG. 15 assumes the memory system has a nominal magnitude of the initial program pulse. In one embodiment, this nominal magnitude is set during die sort to obtain a standard performance. The result of FIG. 15 is Controller 244 choosing to raise or lower the current magnitude of the initial program pulse by 1-6 multiples of ΔVpgm. In one embodiment, ΔVpgm is equal to 0.4 volts for upper page programming. In this example, the system seeks to have a programming process be performed using 17-18 program pulses. Therefore, if the PC for the previously programmed word line is 17 or 18, the magnitude of the initial program pulse will not change for the current word line. If the PC for the previously programmed word line is greater than 18, then the magnitude of the initial program pulse will increase in order to speed up the programming process. If the PC for the previously programmed word line is less than 17, then the magnitude of the initial program pulse may be lowered in order to slow down programming. In one embodiment, PC=14 is the Lower_Limit referred to in step 714 of FIG. 12, and if the PC for the previous WL is 14 or less, then Controller 244 will read the program data to make sure there are no errors.

For example, when programming the upper page for the current word line WLn, if the upper page for the previously programmed word line WLn−1 was 20 and the offset for the previous word line was 3, then the offset for programming the upper page of the current word line will be 4. That is, when programming the upper page of the current word line, the magnitude of the initial program pulse will be raised from the nominal magnitude by 4×ΔVpgm. Similarly, if the PC for programming the upper page of the previous word line is 15 and the offset for programming the upper page of the previous word line was 5, then programming the upper page of the current word line will use programming pulses with a lower initial magnitude than the previous word line such that the magnitude of the initial program pulse for the programming upper page of the current word line will be equal to the nominal voltage plus 3×ΔVpgm. In one example embodiment, ΔVpgm is equal to 0.4 volts when programming the upper page.

FIG. 16 provides a table implementing the function used by Controller 244 in step 708 of FIG. 12 for determining the magnitude of the initial programming pulse for the stage of programming that programs the lower page. The left most column shows the PC for the most recently programmed word line for the same stage as currently being programmed. The four columns on the right indicate the amount of shift from the nominal magnitude initial program voltage for the previously programmed word line. In this example, ΔVpgm is equal to 0.7 volts for lower page programming. Additionally, in the example of FIG. 16, the system seeks to complete lower page programming with 8-9 program pulses. Therefore, if the PC for the most recently programmed word line for the same stage as currently being programmed was 8 or 9, then the magnitude of the initial programming pulse remains the same. If the PC for the most recently programmed word line for the same stage as currently being programmed was greater than nine, the magnitude initial program pulse will be raised. If PC for the most recently programmed word line for the same stage as currently being programmed is less than eight, the magnitude of the initial program pulse will be lowered, as per FIG. 16. For example, if the system is programming the lower page of WL3, and PC for WL2 was 12 and the shift of the magnitude initial program pulse was two when programming the lower page of WL2, then when programming WL3's lower page the shift (in units of ΔVpgm) for the magnitude of the initial program pulse is 3×ΔVpgm.

FIG. 17 provides a programming example as a result of using in the table of FIG. 15 which governs upper page or second-stage programming. The left most column shows the current word line being programmed (upper page programming—the second stage of the multi-stage programming process). The middle column, shift, indicates how much (in units of ΔVpgm) the magnitude of the initial program voltage was shifted up from the nominal initial program voltage. The right most column, PC, indicates how many program pulses were performed when programming the upper page for that word line. In one embodiment, the present technology described herein is not used for the first word line or the first set of word lines.

The example of FIG. 17 indicates that when programming WL2, there was no shift used for the magnitude of the initial program pulse and it took 22 program pulses to complete programming of the upper page (second stage). Therefore, pursuant to the table of FIG. 15, the magnitude of the initial program pulse is raised by 1×ΔVpgm. When programming WL3, it still took 21 program pulses; therefore, the magnitude of the initial program pulse is raised by another 1×ΔVpgm for programming the upper page (second stage) of the next word line (WL4). This trend continues until programming the upper page of WL6, in which case it took 18 program pulses. FIG. 15 indicates that when the programming takes 17 or 18 program pulses, the magnitude of the initial program pulse does not change. Therefore, the shift will remain at 4×ΔVpgm.

When programming the upper page of WL12, the PC lowers to 15; therefore, when programming the upper page of the next word line WL13, Controller 244 shifts down the magnitude of the initial program pulse to only 2×ΔVpgm. When programming WL13, 17 program pulses were used to program the upper page; therefore, there will be no change for the magnitude of the initial program pulse when programming the upper page of the next word line. When programming the upper page of WL14, twenty program pulses were applied; therefore, the magnitude of the initial program pulse will be raised when programming the upper page of the next word line (which is WL15). When programming WL16-20, the number of program loops is 18, 17, 17, 18 respectively; therefore, there is no need to change the magnitude of the initial program pulse.

In some embodiments, the magnitude of the initial program pulse will also be based on the number of program-erase cycles performed. For example, one implementation can limit the amount of change of Vpgm_init based on how many program-erase cycles have been performed by a block or by the entire memory. A device that has less than 1,000 cycles may only be allowed to raise the magnitude of the initial program pulse by a small amount while a device that has undergone 10,000 program-erase cycles may be allowed to increase the magnitude of the initial program pulse by a greater amount.

In another embodiment, the Controller, state machine or other component can analyze the threshold voltages of the memory cells after a programming operation in order to look for an upper tail in any data state. An upper tail is a group of memory cells that have threshold voltages higher than the intended threshold voltage distribution for that particular data state. If an upper tail is found for any data state, the magnitude of the initial program pulse will be lowered when programming the same stage (or any stage) for the next word line.

As discussed above, when programming a particular stage of a multi-stage programming process, the system will look at the performance of that particular stage for previously programmed word lines. In some embodiments, this technique will be used only for odd word lines, or only for even word lines. That is, when performing a particular stage of a multi-stage programming process for an odd word line, the system will determine the magnitude of the voltage initial program pulse based on the performance of that same particular stage of the multi-stage programming process only when used for previously programmed odd word lines. When programming the particular stage of the multi-stage programming process on the even word line, the system will set the magnitude initial of the programming pulse based on prior performance of the same particular stage when performed on the previously programmed even word lines.

In some embodiments, the change in magnitude of the initial program pulse can be limited or dampened such that it does not change more than the predetermined amount from one word line to an adjacent word line. Other variations can also be used.

In one embodiment, the initial non-zero magnitude of the program pulses is reset to a default value when starting programming for a new block. In another embodiment, the initial non-zero magnitude of the program pulses is periodically reset to a default value.

One embodiment includes a method of programming data into non-volatile storage comprising: programming non-volatile storage elements connected to a first set of one or more word lines using one or more stages of a multi-stage programming process, the multi-stage programming process includes at least a particular stage and an additional stage; determining a voltage magnitude of an initial program pulse for the particular stage of the multi-stage programming process as a function of number of program pulses applied for the particular stage when the particular stage was used to program the non-volatile storage elements connected to the first set of one or more word lines; and programming non-volatile storage elements connected to a selected word line using the particular stage of the multi-stage programming process with the initial program pulse having the determined voltage magnitude, the selected word line is not in the first set of one or more word lines.

One embodiment includes a non-volatile storage system, comprising: non-volatile storage elements; word lines including a first set of one or more word lines and a selected word line that is not in the first set of one or more word lines, a first subset of the non-volatile storage elements are connected to the first set of one or more word lines, a second subset of the non-volatile storage elements are connected to the selected word line; and one or more managing circuits in communication with the non-volatile storage elements and the word lines. The one or more managing circuits program the first subset of the non-volatile storage elements using one or more stages of a multi-stage programming process. The multi-stage programming process includes at least a particular stage and an additional stage. The one or more managing circuits determine a voltage magnitude of an initial program pulse for the particular stage of the multi-stage programming process as a function of number of program pulses applied for the particular stage when the particular stage was used to program the first subset of the non-volatile storage. The one or more managing circuits program the second subset of non-volatile storage elements using the particular stage of the multi-stage programming process with the initial program pulse having the determined voltage magnitude.

One embodiment includes a method of programming data into non-volatile storage comprising: causing programming of non-volatile storage elements connected to a first set of one or more word lines using one or more stages of a multi-stage programming process, the multi-stage programming process includes at least a particular stage and an additional stage; determining an initial non-zero magnitude of a programming signal as a function of past performance of the particular stage when programming the non-volatile storage elements connected to the first set of one or more word lines; and causing programming of non-volatile storage elements connected to a selected word line using the particular stage of the multi-stage programming process with the programming signal having the determined initial non-zero magnitude, the selected word line is not in the first set of one or more word lines.

One embodiment includes a non-volatile storage system, comprising: data storage; a memory interface; and one or more processors in communication with the data storage and the memory interface. The one or more processors send data and commands to a memory system having non-volatile storage elements via the memory interface. The memory system including a first set of one or more word lines and a selected word line that is not in the first set of one or more word lines. A first subset of the non-volatile storage elements are connected to the first set of one or more word lines. A second subset of the non-volatile storage elements are connected to the selected word line. The one or more processors cause programming of the first subset of non-volatile storage elements using one or more stages of a multi-stage programming process. The multi-stage programming process includes at least a particular stage and an additional stage. The one or more processors determine an initial non-zero magnitude of a programming signal as a function of past performance of the particular stage when programming the first subset of non-volatile storage elements. The one or more processors cause programming of the second subset of non-volatile storage elements using the particular stage of the multi-stage programming process with the programming signal having the determined initial non-zero magnitude.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method of programming data into non-volatile storage comprising:
   programming non-volatile storage elements connected to a first set of one or more word lines using one or more stages of a multi-stage programming process, the multi-stage programming process includes at least a particular stage and an additional stage;
   determining a voltage magnitude of an initial program pulse for the particular stage of the multi-stage programming process as a function of number of program pulses applied for the particular stage when the particular stage was used to program the non-volatile storage elements connected to the first set of one or more word lines; and
   programming non-volatile storage elements connected to a selected word line using the particular stage of the multi-stage programming process with the initial program pulse having the determined voltage magnitude.

2. The method of claim 1, wherein:
   the function is implemented by a look-up table.

3. The method of claim 1, wherein:
   the function is a moving average of total number of program pulses applied for the particular stage when the particular stage was used to program the non-volatile storage elements connected to one or more word lines of the first set of one or more word lines.

4. The method of claim 1, wherein:
   the determining the voltage magnitude of the initial program pulse is further based on a number of program-erase cycles performed.

5. The method of claim 1, wherein:
   the determining the voltage magnitude of the initial program pulse is further based on whether an upper tail of non-volatile storage elements is detected for a data state such that presence of the upper tail causes a reduction in the voltage magnitude of the initial program pulse.

6. The method of claim 1, wherein:
   the determining the voltage magnitude of the initial program pulse is further based on a number of bits in error when the data in the non-volatile storage elements is read back.

7. The method of claim 1, wherein:
   the first set of one or more word lines include odd numbered word lines; and
   the first set of one or more word lines do not include even numbered word lines.

8. The method of claim 1, wherein:
   the first set of one or more word lines include even numbered word lines; and
   the first set of one or more word lines do not include odd numbered word lines.

9. The method of claim 1, wherein:
   the determining the voltage magnitude of the initial program pulse includes determining a change in voltage magnitude from a previous initial program pulse and limiting the change.

10. The method of claim 1, further comprising:
    determining if a total number of program pulses used when performing the particular stage of the multi-stage programming process on the non-volatile storage elements connected to the selected word line is less than a lower limit; and
    re-programming data targeted for the non-volatile storage elements connected to the selected word line if the total number of program pulses is less than the lower limit.

11. The method of claim 1, wherein:
    the multi-stage programming process is a two stage programming process that programs two bits per non-volatile storage element, one of the two bits is programmed into a lower page and the other of the two bits is programmed into an upper page;
    the first stage of the multi-stage programming process is an additional stage which programs the lower page of data; and
    the second stage of the multi-stage programming process is a particular stage which programs the upper page of data.

12. A non-volatile storage system, comprising:
    non-volatile storage elements;
    word lines including a first set of one or more word lines and a selected word line that is not in the first set of one or more word lines, a first subset of the non-volatile storage elements are connected to the first set of one or more word lines, a second subset of the non-volatile storage elements are connected to the selected word line; and one or more managing circuits in communication with the non-volatile storage elements and the word lines, the one or more managing circuits program the first subset of the non-volatile storage elements using one or more stages of a multi-stage programming process, the multi-stage programming process includes at least a particular stage and an additional stage, the one or more managing circuits determine a voltage magnitude of an initial program pulse for the particular stage of the multi-stage programming process as a function of the number of program pulses applied for the particular stage when the particular stage was used to program the first subset of the non-volatile storage, the one or more managing circuits program the second subset of non-volatile storage elements using the particular stage of the multi-stage programming process with the initial program pulse having the determined voltage magnitude.

13. The non-volatile storage system of claim 12, wherein: the function is implemented by a look-up table.

14. The non-volatile storage system of claim 12, wherein: the function is a moving average of total number of program pulses applied for the particular stage when the particular stage was used to program the non-volatile storage elements connected to one or more word lines of the first set of one or more word lines.

15. The non-volatile storage system of claim 12, wherein: the one or more managing circuits determine the voltage magnitude of the initial program pulse additionally based on a number of program-erase cycles performed.

16. The non-volatile storage system of claim 12, wherein: the one or more managing circuits determine the voltage magnitude of the initial program pulse additionally based on whether an upper tail of non-volatile storage elements is detected for a data state such that presence of the upper tail causes a reduction in the voltage magnitude of the initial program pulse.

17. The non-volatile storage system of claim 12, wherein: the one or more managing circuits determine if a total number of program pulses used when performing the particular stage of the multi-stage programming process on the non-volatile storage elements connected to the selected word line is less than a lower limit; and the one or more managing circuits re-program the data targeted for the non-volatile storage elements connected to the selected word line if the total number of program pulses is less than the lower limit.

18. A method of programming data into non-volatile storage comprising:

causing programming of non-volatile storage elements connected to a first set of one or more word lines using one or more stages of a multi-stage programming process, the multi-stage programming process includes at least a particular stage and an additional stage;

determining an initial non-zero magnitude of a programming signal as a function of past performance of the particular stage when programming the non-volatile storage elements connected to the first set of one or more word lines; and causing programming of non-volatile storage elements connected to a selected word line using the particular stage of the multi-stage programming process with the programming signal having the determined initial non-zero magnitude, the selected word line is not in the first set of one or more word lines.

19. The method of claim 18, wherein: the determining an initial non-zero magnitude of the programming signal comprises determining a voltage magnitude of an initial program pulse for the particular stage of the multi-stage programming process.

20. The method of claim 18, wherein: the non-volatile storage elements are arranged in a memory chip; and a controller separate from and connected to the memory chip performs the causing programming of non-volatile storage elements connected to a first set of one or more word lines, determining an initial non-zero magnitude of a programming signal and causing programming of non-volatile storage elements connected to a selected word line.

21. The method of claim 18, wherein: the determining an initial non-zero magnitude of the programming signal is further based on a number of program-erase cycles performed.

22. The method of claim 18, further comprising: determining if a total number of program pulses used when performing the particular stage of the multi-stage programming process on the non-volatile storage elements connected to the selected word line is less than a lower limit; and causing re-programming of data targeted for the non-volatile storage elements connected to the selected word line if the total number of program pulses is less than the lower limit.

23. The method of claim 18, further comprising: resetting the initial non-zero magnitude to a default value when starting programming for a new block.

24. The method of claim 18, further comprising: periodically resetting the initial non-zero magnitude to a default value.

25. A non-volatile storage system, comprising:
data storage;
a memory interface; and
one or more processors in communication with the data storage and the memory interface, the one or more processors send data and commands to a memory system having non-volatile storage elements via the memory interface, the memory system including a first set of one or more word lines and a selected word line that is not in the first set of one or more word lines, a first subset of the non-volatile storage elements are connected to the first set of one or more word lines, a second subset of the non-volatile storage elements are connected to the selected word line;

the one or more processors cause programming of the first subset of non-volatile storage elements using one or more stages of a multi-stage programming process, the multi-stage programming process includes at least a particular stage and an additional stage;

the one or more processors determine an initial non-zero magnitude of a programming signal as a function of past performance of the particular stage when programming the first subset of non-volatile storage elements;

the one or more processors cause programming of the second subset of non-volatile storage elements using the particular stage of the multi-stage programming process with the programming signal having the determined initial non-zero magnitude.

26. The non-volatile storage system of claim 25, wherein: the one or more processors are part of a controller that communicates with a memory circuit.

27. The non-volatile storage system of claim 25, wherein:
the one or more processors determine the initial non-zero magnitude of the programming signal by determining a voltage magnitude of an initial program pulse for the particular stage of the multi-stage programming process.

28. The non-volatile storage system of claim 25, wherein:
the one or more managing circuits determine if a total number of program pulses used when performing the particular stage of the multi-stage programming process on the non-volatile storage elements connected to the selected word line is less than a lower limit; and
the one or more managing circuits cause re-programming of data targeted for the non-volatile storage elements connected to the selected word line if the total number of program pulses is less than the lower limit.

* * * * *